(12) United States Patent  
Fujita et al.

(10) Patent No.: US 10,350,711 B2  
(45) Date of Patent: Jul. 16, 2019

(54) SEMICONDUCTOR DEVICE AND MANUFACTURING METHOD THEREOF

(71) Applicant: TOSHIBA MEMORY CORPORATION, Minato-ku (JP)

(72) Inventors: Tsutomu Fujita, Yokkaichi (JP); Akira Tomono, Yokkaichi (JP); Takanobu Ono, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/916,524

(22) Filed: Mar. 9, 2018

(65) Prior Publication Data

US 2019/0084080 A1    Mar. 21, 2019

(30) Foreign Application Priority Data

Sep. 20, 2017    (JP) ................... 2017-180403

(51) Int. Cl.
| | |
|---|---|
| *H01L 23/48* | (2006.01) |
| *H01L 23/52* | (2006.01) |
| *H01L 29/40* | (2006.01) |
| *B23K 26/50* | (2014.01) |
| *B23K 101/40* | (2006.01) |

(52) U.S. Cl.
CPC ............ *B23K 26/50* (2015.10); *H01L 23/481* (2013.01); *B23K 2101/40* (2018.08); *H01L 2224/0401* (2013.01); *H01L 2224/05005* (2013.01); *H01L 2224/06181* (2013.01)

(58) Field of Classification Search
USPC .............. 257/777, 678–733, 774, 787–796, 257/E23.001–E23.194, E21.502, 257/E21.499–E21.519; 438/15, 26, 51, 438/55, 64, 106, 124–127
See application file for complete search history.

(56) References Cited

U.S. PATENT DOCUMENTS

| | | | |
|---|---|---|---|
| 6,825,532 B2 | 11/2004 | Linn et al. | |
| 8,878,349 B2 | 11/2014 | Lee et al. | |
| (Continued) | | | |

FOREIGN PATENT DOCUMENTS

| | | |
|---|---|---|
| JP | 2000-269471 A | 9/2000 |
| JP | 2006-140356 | 6/2006 |
| (Continued) | | |

*Primary Examiner* — Niki H Nguyen
(74) *Attorney, Agent, or Firm* — Oblon, McClelland, Maier & Neustadt, L.L.P.

(57) ABSTRACT

A semiconductor device is provided with a semiconductor substrate. A semiconductor element is provided on a first face of the semiconductor substrate. An energy absorbing film is provided on the first face, to absorb optical energy to generate heat. A first insulation film is provided on the semiconductor element and on the energy absorbing film. A second insulation film is provided on a second face of the semiconductor substrate, the second face being opposite to the first face. A first modified layer is provided on a side face of the semiconductor substrate, the side face being located between an outer edge of the first face and an outer edge of the second face. A second modified layer is provided on the side face between the energy absorbing film and the first modified layer. A cleavage face is provided on the side face between the first and second modified layers.

17 Claims, 4 Drawing Sheets

(56) References Cited

U.S. PATENT DOCUMENTS

2006/0166466 A1\* 7/2006 Maki ................. H01L 21/67132
           438/464
2017/0062277 A1\* 3/2017 Schrems ........... H01L 21/76898

FOREIGN PATENT DOCUMENTS

| JP | 2008166445 A | \* | 7/2008 |
| JP | 2010-3817 | | 1/2010 |
| JP | 2014-75487 | | 4/2014 |
| TW | 200703496 A | | 1/2007 |

\* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2017-180403, filed on Sep. 20, 2017, the entire contents of which are incorporated herein by reference.

FIELD

Embodiments relate to a semiconductor device and a manufacturing method thereof.

BACKGROUND

A dicing technique has been developed, in which a semiconductor wafer is cut into pieces of semiconductor chips by emitting a laser beam to a dicing area of the semiconductor wafer. In the dicing technique, crystals inside the semiconductor wafer are modified by the laser beam and then, from the modified portions, the semiconductor wafer is split into the pieces of the semiconductor chips.

On the side faces of each semiconductor chip manufactured in the above way, a modified layer by means of the laser beam improves adhesiveness with a package resin and also improves an impurity gettering effect. On the other hand, such a modified layer decreases the strength of the semiconductor chip itself, which may lead to defects of elements formed on the semiconductor chip.

DETAILED DESCRIPTION

Embodiments will now be explained with reference to the accompanying drawings. The present invention is not limited to the embodiments. In the following embodiment, concerning the vertical direction of a semiconductor substrate, there are one case in which a first face on which a semiconductor element is provided is an upper surface and another case in which a second surface having no semiconductor elements provided thereon is the upper surface, which may be in different directions from the directions in accordance with gravitational acceleration. The drawings are schematic or conceptual, with the ratio of component parts, and the like, not necessarily being the same as actual ones. In the specification and drawings, the same signs are given to the same elements as those described with reference to the drawings previously shown, with a detailed description thereof being omitted, as required.

A semiconductor device according to the present embodiment is provided with a semiconductor substrate. A semiconductor element is provided on a first face of the semiconductor substrate. An energy absorbing film is provided on the first face, to absorb optical energy to generate heat. A first insulation film is provided on the semiconductor element and on the energy absorbing film. A second insulation film is provided on a second face of the semiconductor substrate, the second face being opposite to the first face. A first modified layer is provided on a side face of the semiconductor substrate, the side face being located between an outer edge of the first face and an outer edge of the second face. A second modified layer is provided on the side face between the energy absorbing film and the first modified layer. A cleavage face is provided on the side face between the first and second modified layers.

Figure 1:
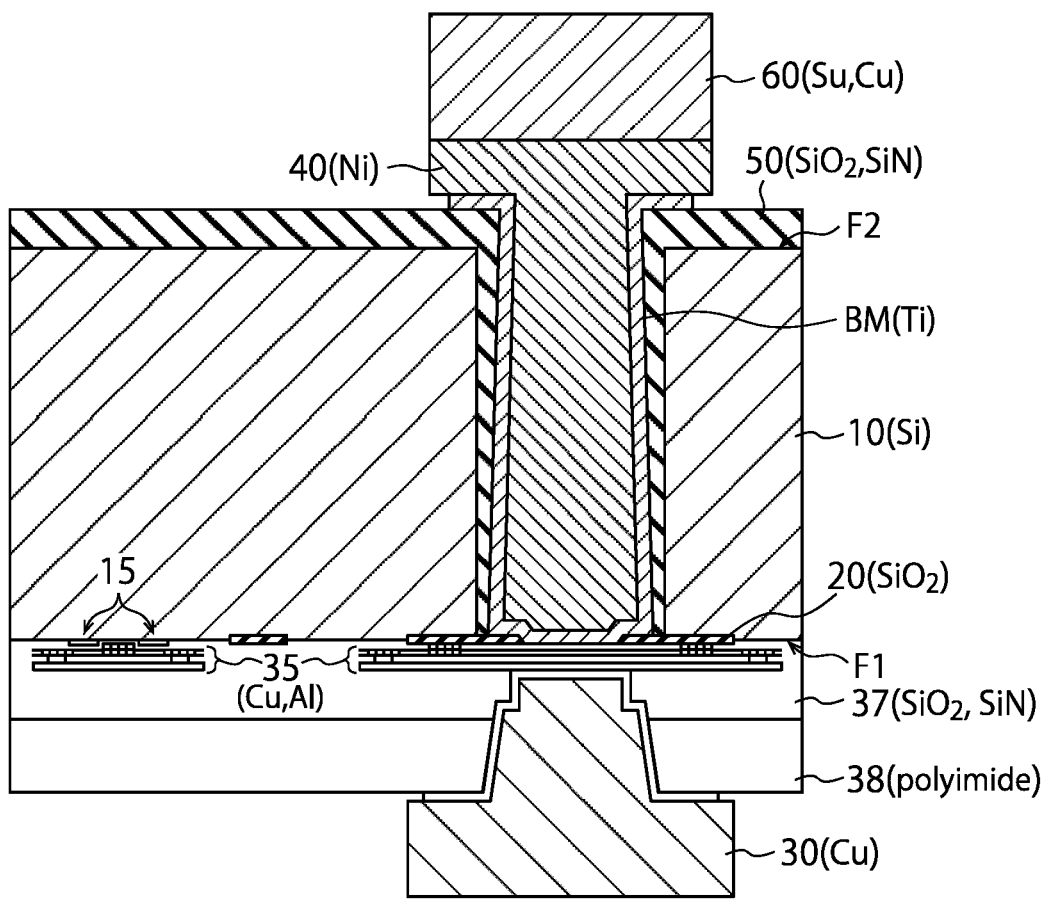
FIG. 1 is a sectional view showing a configuration example of a semiconductor chip 1 according to the present embodiment.

FIG. 1 is a sectional view showing a configuration example of a semiconductor chip 1 according to the present embodiment. The semiconductor chip 1 according to the present embodiment is, for example, a semiconductor memory such as a NAND EEPROM (Electrically Erasable and Programmable Read-Only-Memory). FIG. 1 shows a TSV and its peripheral area, of the semiconductor chip 1.

The semiconductor chip 1 is provided with a semiconductor substrate 10, semiconductor elements 15, an STI (Shallow Trench Isolation) 20, a pad (bump) 30, wiring layers 35, first insulation films 37 and 38, a TSV 40, a second insulation film 50, and a bump 60.

The semiconductor substrate 10 is, for example, a silicon substrate and is, for example, formed into a thin film of about 30 μm. The semiconductor substrate 10 has a first face F1 and a second face F2 that is located opposite to the first face F1. Provided on the first face F1 of the semiconductor substrate 10 are active areas for forming the semiconductor elements 15 and the STI (Shallow Trench Isolation) 20 that electrically isolates the active areas from each other. The semiconductor elements 15, such as a memory cell array, a transistor, a resistor, and a capacitor, is formed in each active area. For the STI 20, for example, an insulation film such as a silicon oxide film is used. On the STI 20, not semiconductor elements, but the pad 30 and the wiring layers 35 each for electrically connecting the semiconductor elements 15 to the TSV 40 are provided. The semiconductor elements 15 are provided on the first face F1 of the semiconductor substrate 10.

On the second face F2 of the semiconductor substrate 10, not semiconductor elements, wirings, etc., but the bump 60 electrically connected to the TSV 40, and the like, are provided. The pad 30 and the wiring layers 35 are provided on the first face F1 of the semiconductor substrate 10 and are electrically connected to the semiconductor elements 15 (such as a transistor). For the pad 30 and the wiring layers 35, a low resistive metal such as copper, aluminum, tungsten, and titanium, is used. The wiring layers 35 function as an energy absorbing film that absorbs optical energy of a dicing laser to generate heat. The pad 30 may also function as part of the energy absorbing film.

The TSV 40 and a barrier metal BM are provided between the first and second faces F1 and F2 of the semiconductor substrate 10 to penetrate through the semiconductor substrate 10. Moreover, the TSV 40 and the barrier metal BM penetrate through the STI 20 to be electrically connected to the conductors 30 and 35. In this way, the TSV 40 and the barrier metal BM extend electrical connection with the wiring layers 35 located on the first-face F1 side to the second-face F2 side. For the TSV 40, for example, a low resistive metal, such as nickel, is used. The barrier metal BM is provided on the side face of the second insulation film (also referred to as a spacer film, hereinafter) 50. For the barrier metal BM, for example, Ti, Ta or Ru, or a laminated film of these metals is used. Hereinafter, the TSV 40 and the barrier metal BM are together referred to as metal electrodes 40 and BM. It is not always necessary to provide the barrier metal BM as long as the TSV 40 can be appropriately embedded in a contact hole CH.

The first insulation films 37 and 38 are provided on the semiconductor element 15 and the wiring layers 35 each located on the first face F1 of the semiconductor substrate 10. For the insulation film 37, for example, a silicon oxide film, a silicon nitride film, etc. is used. For the insulation film 38, for example, an organic film, such as polyimide, is used.

The spacer film 50 as the second insulation film is provided on the second face F2 of the semiconductor substrate 10, opposite to the first face F1. Moreover, the spacer film 50 is provided between the metal electrodes 40 and BM, and the semiconductor substrate 10 to electrically isolate the metal electrodes 40 and BM, and the semiconductor substrate 10. For the spacer film 50, for example, an insulation film, such as, a silicon oxide film, a silicon nitride film, etc. is used.

The bump 60 is provided on the TSV 40 at the second-face F2 side of the semiconductor substrate 10. For the bump 60, for example, a metal, such as tin, copper, etc., is used.

Figure 2:
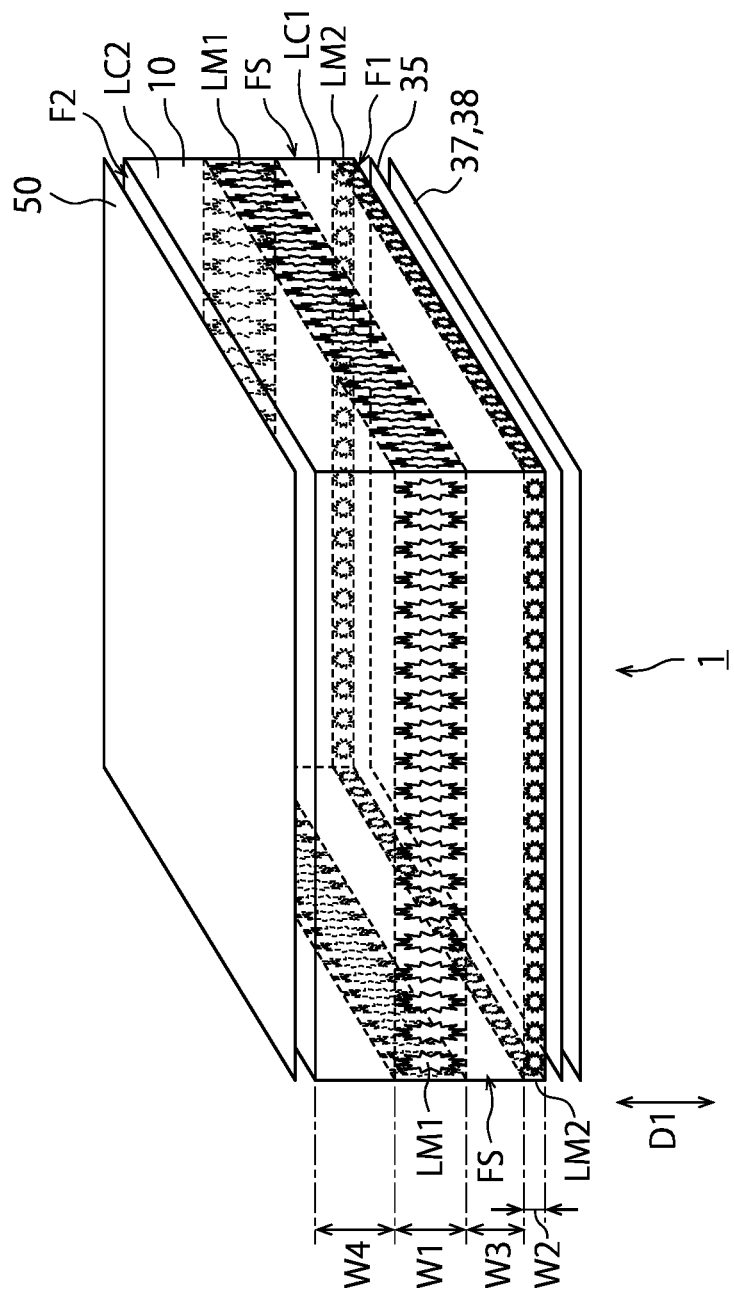
FIG. 2 is a conceptual perspective view showing the state of the side faces of the semiconductor chip 1.

FIG. 2 is a conceptual perspective view showing the state of the side faces of the semiconductor chip 1. The semiconductor substrate 10 has side faces FS that connect the outer edges of the first and second faces F1 and F2. Provided on the side faces FS are a first modified layer LM1, a second modified layer LM2, and cleavage faces LC1 and LC2.

The first modified layer LM1 is provided, like a belt, on the side faces FS, so as to extend almost parallel to the first and second faces F1 and F2, located at the middle point between the first and second faces F1 and F2. The first modified layer LM1 is a layer of crystal defects caused by modification of the semiconductor substrate 10, which is formed by a dicing laser on the surface layer of the side faces FS of the semiconductor substrate 10. As described later, the dicing laser is intermittently emitted to a dicing area of a semiconductor wafer to modify (for example, amorphization or polycrystallization) crystals (silicon crystals) of the semiconductor wafer with heat at a focal point. As a result, the crystal defect portions of the first modified layer LM1 are intermittently provided on the side faces FS of the semiconductor substrate 10.

The first modified layer LM1 has a thickness (width) W1 of, for example, 10 µm or smaller in a D1-direction that is a thickness direction of the semiconductor substrate 10 (a direction from the first face F1 to the second face F2 or vice versa). The crystal defects of the first modified layer LM1 have a larger size than the crystal defects of the second modified layer LM2.

In the same manner as the first modified layer LM1, the second modified layer LM2 is provided, like a belt, on the side faces FS, so as to extend almost parallel to the first and second faces F1 and F2. However, the second modified layer LM2 is provided closer than the first modified layer LM1 to the first face F1. In detail, the second modified layer LM2 is provided on the side faces FS between the wiring layers 35 and the first modified layer LM1 and is provided on the surface layer of the first face F1. The second modified layer LM2 is also a layer of crystal defects caused by modification of the semiconductor substrate 10 with the dicing laser, formed on the surface layer of the side faces FS of the semiconductor substrate 10. The crystal defect portions of the second modified layer LM2 are intermittently provided on the side faces FS of the semiconductor substrate 10, in the same manner as the crystal defect portions of the first modified layer LM1. The second modified layer LM2 has a thickness (width) W2 of, for example, 10 µm or smaller in the D1-direction.

The cleavage face LC1 is provided on the side faces FS between the first and second modified layers LM1 and LM2. The cleavage face LC2 is provided on the side faces FS between the first modified layer LM1 and the second face F2. The cleavage faces LC1 and LC2 are a cleavage face of the semiconductor substrate 10 (for example, a silicon substrate), which is a crystal plane of a silicon monocrystal. Therefore, the cleavage faces LC1 and LC2 have fewer crystal defects than the first and second modified layers LM1 and LM2, which have a surface in the state of a mirror surface having almost no concavities and convexities. In other words, the cleavage faces LC1 and LC2 have a smooth surface having almost no modified surfaces by means of the dicing laser. The cleavage faces LC1 and LC2 respectively have thicknesses (widths) W3 and W4 of, for example, 10 µm or larger in the D1-direction.

For example, in laser dicing, a laser cuts a semiconductor wafer while modifying the semiconductor wafer. Therefore, a modified semiconductor chip has a modified layer (modified face) at the side face of the chip. The modified layer (modified face) is made of, for example, a material of modified silicon monocrystal of amorphous silicon, polysilicon, etc., having a lot of crystal defects.

As described above, the semiconductor substrate 10 according to the present embodiment has the side faces FS that have a four-layer structure of the first and second modified layers LM1 and LM2 each modified by the dicing laser and of the cleavage faces LC1 and LC2 each having few crystal defects.

On the side faces FS, the areas other than the first and second modified layers LM1 and LM2 are the cleavage faces LC1 and LC2. Having this structure, the mechanical strength of the semiconductor chip 1 itself is maintained. For example, if the entire side faces FS are modified, the modified layer has a lot of crystal defects with relatively large concavities and convexities. In this case, the semiconductor chip 1 has a low mechanical strength to be easily damaged or cracked. On the contrary, the semiconductor chip 1 according to the present embodiment has the cleavage faces LC1 and LC2 to maintain a certain level of mechanical strength.

Nevertheless, if the side faces FS are a cleavage face entirely, impurities such as metal ions tend to enter the semiconductor chip 1 through the side faces FS, which may give an adverse effect on the semiconductor elements 15. Moreover, since the cleavage face has a smooth surface, the package resin and the side faces FS have low adhesiveness, so that the package resin tends to be peeled off from the side faces FS. On the contrary, the semiconductor chip 1 according to the present embodiment has the first and second modified layers LM1 and LM2 on the side faces FS. Since the first and second modified layers LM1 and LM2 have comparatively a lot of crystal defects to exhibit a gettering effect to impurities such as metal ions. Therefore, having the first modified layer LM1 provided on the side faces FS between the first and second faces F1 and F2, entering of impurities from the side faces FS can be restricted at a certain level. Moreover, the second modified layer LM2 is provided on the side faces FS at the first-face F1 side (directly under the wiring layers 35) where the semiconductor elements 15 are located. It can be said that the second modified layer LM2 is provided on the side faces FS at the surface side of the first face F1 of the semiconductor substrate 10. Accordingly, entering of impurities from the side faces FS near the first face F1 of the semiconductor substrate 10 (the side faces FS near the semiconductor elements 15) can be restricted at a certain level.

Furthermore, having the first and second modified layers LM1 and LM2 provided on the side faces FS, adhesiveness between the package resin and the side faces FS enhances, so that the package resin is hardly peeled off from the side faces FS.

In order to provide the second modified layer LM2, the wiring layers 35, as an energy absorbing film, are provided on the first face F1. As described later, the wiring layers 35 absorb a laser beam to modify the surface layer of the semiconductor substrate 10 at the first-face F1 side. In this way, the second modified layer LM2 is provided on the semiconductor substrate 10 directly under the wiring layers 35. In order to provide the second modified layer LM2 on the side faces FS of the semiconductor substrate 10, the wiring layers 35 are provided up to above the outer edge of the first face F1 of the semiconductor chip 1. In other words, in the semiconductor wafer, the wiring layers 35 are also provided on the dicing line. In this way, the second modified layer LM2 is formed on the semiconductor substrate 10 directly under the wiring layers 35 on the dicing line.

As described above, in the semiconductor chip 1, the side faces FS of the semiconductor substrate 10 can be formed to have a four-layer structure of the modified layers LM1 and LM2, and the cleavage faces LC1 and LC2. The modified layers LM1 and LM2 can restrict entering of impurities from the middle areas of the side faces FS, from the side faces FS near the semiconductor elements 15, and so on. Along with this, adhesiveness between the package resin and the semiconductor chip 1 can be enhanced. Moreover, the cleavage faces LC1 and LC2 can maintain the mechanical strength of the semiconductor chip 1.

Moreover, the first insulation films 37 and 38 can restrict the entering of impurities from the first face F1. The spacer film 50 as the second insulation film can restrict the entering of impurities from the second face F2. In other words, the first insulation films 37 and 38, and the second insulation film 50 are provided for enhancement of the gettering effect. As described, according to the present embodiment, not only the entering of impurities from the first and second faces F1 and F2, but also the entering of impurities from the side faces FS can be restricted by the first and second modified layers LM1 and LM2.

A manufacturing method of a semiconductor device according to the present embodiment will be explained next.

Figure 3A:
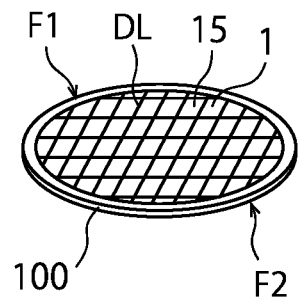
FIGS. 3A to 3C are a perspective view or a sectional view showing one example of a manufacturing method of the semiconductor chip 1 according to the present embodiment.
Figure 3B:
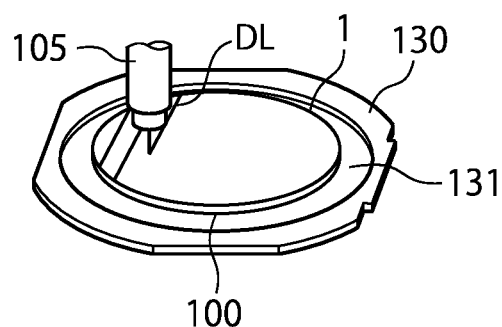
Figure 3C:
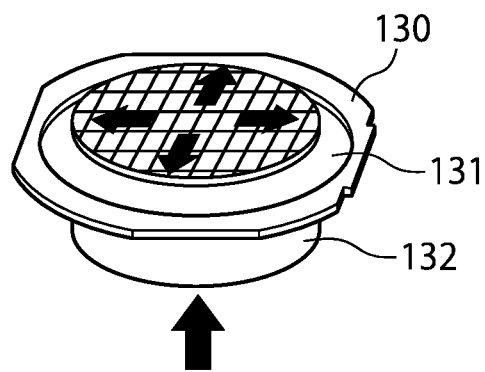

FIGS. 3A to 3C are a perspective view or a sectional view showing one example of a manufacturing method of the semiconductor chip 1 according to the present embodiment.

First of all, the semiconductor elements 15 of FIG. 1 are formed on a first face F1 of a semiconductor wafer 100. Wiring layers 35 are formed on the semiconductor elements 15 and then insulation films 37 and 38 are formed on and around the semiconductor elements 15 and the wiring layers 35. Thereafter, a support substrate is bonded to the first face F1 of the semiconductor wafer 100, followed by polishing (pre-grinding) a second face F2 of the semiconductor wafer 100 by CMP (Chemical Mechanical Polishing). After the semiconductor wafer 100 is polished, a second insulation film 50 is formed on the second face F2 of the semiconductor wafer 100. By pre-grinding, the thickness of the semiconductor wafer 100 becomes 30 μm or smaller. Thereafter, a TSV 40 is formed by a known method so as to penetrate between the first and second faces F1 and F2 (via last process). Moreover, an electrode pad (not shown) is formed on the surface of a semiconductor chip 1. A metal bump (not shown) may be provided on the electrode pad.

FIG. 3A shows the semiconductor wafer 100 after the semiconductor elements 15 and the TSV 40 are formed. Between a plurality of semiconductor chips 1, there are dicing lines DL which are cut as described later to separate the semiconductor chips 1 into a plurality of pieces.

After the support substrate on the first face F1 is removed, as shown in FIG. 3B, the first face F1 of the semiconductor wafer 100 is bonded to a flexible resin tape 131 adhered in a wafering area 130. Subsequently, using a laser oscillator 105, a laser is emitted, along the dicing lines DL, to portions of the second face F2 of the semiconductor wafer 100, the portions corresponding to the dicing lines DL. In this way, the first and second modified layers (amorphous or polysilicon layers) LM1 and LM2 are formed inside the semiconductor wafer 100 (inside the silicon substrate).

Figure 4:
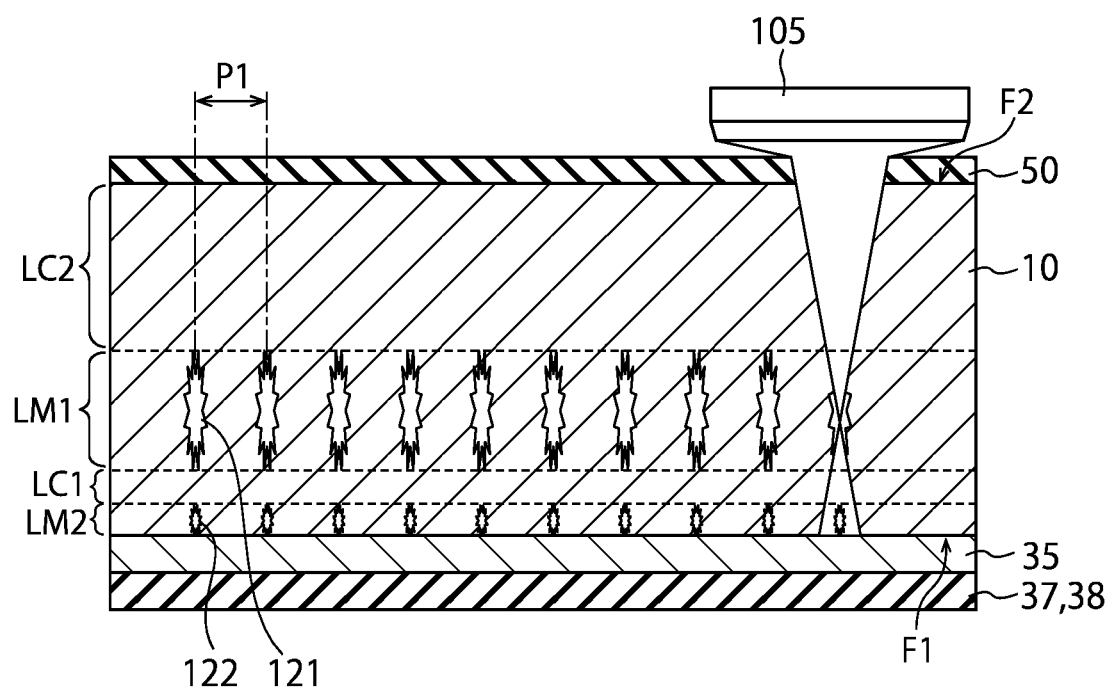
FIG. 4 is a sectional view of the portion along a dicing line DL in FIG. 3B.

FIG. 4 is a sectional view of a portion along each dicing line DL in FIG. 3B. The laser oscillator 105 emits a laser beam to the semiconductor substrate 10 from the second face F2, so that the laser beam is focused on a given depth position in the semiconductor substrate 10. In the present embodiment, the laser beam is emitted to be focused on a middle area between the first and second faces F1 and F2. It is preferable that the laser beam has a wavelength of 800 nm or longer but 3,000 nm or shorter so as to be capable of modifying silicon monocrystals. In the case of a wavelength shorter than 800 nm, the probability that the laser beam is absorbed inside the silicon is increased to make it harder to form a modified layer. In the case of a wavelength exceeding 3,000 nm, the probability that the laser beam passes through the silicon is increased to make it harder to form a modified layer. For example, the laser beam may be, so called, a stealth laser beam. By emitting such a laser beam to the semiconductor substrate 10, at a laser-beam focal point, for example, the silicon monocrystals are heated to be modified into amorphous silicon or polysilicon. In this way, with the laser beam emission, the first modified layer LM1 is formed in the semiconductor substrate 10 located in the middle area between the first and second faces F1 and F2.

Moreover, the laser beam passes through the semiconductor substrate 10 from the focal point toward the first face F1 and is absorbed by the wiring layers 35 as an energy absorbing layer. When absorbing the laser beam, the wiring layers 35 generate heat and then, by the heat, the surface area of the semiconductor substrate 10 near the wiring layers 35 is modified into amorphous silicon or polysilicon. In this way, the second modified layer LM2 is formed in an area of the semiconductor substrate 10 near the first face F1. The laser beam intensity is set to such a level at which the first insulation films 37 and 38 are not dissolved. This is because, if the laser beam intensity is set to such a level at which the first insulation films 37 and 38 are dissolved, due to its heat, the semiconductor elements 15 may be damaged.

The laser beam is emitted at an interval of a certain pitch P1. In this way, modified portions 121 and 122 are formed in the modified layer LM1 at the interval of the pitch P1. When the pitch P1 is narrow, the modified portions 121 are connected to one another to become a layer-like (belt-like) modified layer LM1, and the modified portions 122 are connected to one another to become a layer-like (belt-like) modified layer LM2.

The semiconductor substrate 10 between the first and second modified layers LM1 and LM2 is not modified to remain as the silicon crystals. The semiconductor substrate 10 between the first modified layer LM1 and the first face F1 is also not modified to remain as the silicon crystals. As described later, when the semiconductor wafer 100 is divided into pieces, non-modified portions on the dicing lines become the cleavage faces LC1 and LC2 on the side faces FS. In this stage, the semiconductor wafer 100 is not yet divided into pieces of the semiconductor chips 1.

Subsequently, as shown in FIG. 3C, the resin tape 131 is pushed up by a pushup member 132 to be stretched (expanded). In this way, the semiconductor wafer 100 is stretched outwardly together with the resin tape 131 and is then split along the first and second modified layers LM1 and LM2 (in other words, along the dicing lines) into a plurality of pieces of the semiconductor chips 1. In this way, the semiconductor chips 1 are complete. At the completion, the portions that are not modified in FIG. 4 become the cleavage faces LC1 and LC2 on the side faces FS.

Thereafter, the semiconductor chips 1 are picked up one by one and mounted on a substrate, and then sealed with a package resin, which is the completion of a semiconductor package.

As described above, because of the wiring layers 35 located on the first face F1, the second modified layer LM2 is formed. Accordingly, the side faces FS of the semiconductor substrate 10 can be formed into a four-layer structure of the modified layers LM1 and LM2, and the cleavage faces LC1 and LC2. The modified layers LM1 and LM2 can restrict the entering of impurities from the middle areas of the side faces FS and from the side faces FS near the semiconductor elements 15, and also can enhance adhesiveness between the package resin and each semiconductor chip 1. Moreover, the cleavage faces LC1 and LC2 can maintain the mechanical strength of the semiconductor chip 1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   a semiconductor element provided on a first face of the semiconductor substrate;
   an energy absorbing film provided on the first face, the energy absorbing film absorbing optical energy to generate heat;
   a first insulation film provided on the semiconductor element and on the energy absorbing film;
   a second insulation film provided on a second face of the semiconductor substrate, the second face being opposite to the first face;
   a first modified layer provided on a side face of the semiconductor substrate, the side face being located between an outer edge of the first face and an outer edge of the second face, the first modified layer including a crystal defect;
   a second modified layer provided on the side face between the energy absorbing film and the first modified layer, the second modified layer including a crystal defect; and
   a cleavage face provided on the side face between the first and second modified layers.

2. The semiconductor device according to claim 1, wherein the second modified layer is provided on the side face directly under the energy absorbing film.

3. The semiconductor device according to claim 1, wherein the energy absorbing film is a metal film.

4. The semiconductor device according to claim 2, wherein the energy absorbing film is a metal film.

5. The semiconductor device according to claim 1, wherein the energy absorbing film is provided on the first insulation film up to above the outer edge of the first face.

6. The semiconductor device according to claim 2, wherein the energy absorbing film is provided on the first insulation film up to above the outer edge of the first face.

7. The semiconductor device according to claim 3, wherein the energy absorbing film is provided on the first insulation film up to above the outer edge of the first face.

8. The semiconductor device according to claim 1, wherein the second modified layer is provided on the semiconductor substrate directly under the semiconductor element.

9. The semiconductor device according to claim 2, wherein the second modified layer is provided on the semiconductor substrate directly under the semiconductor element.

10. The semiconductor device according to claim 3, wherein the second modified layer is provided on the semiconductor substrate directly under the semiconductor element.

11. The semiconductor device according to claim 1, wherein the crystal defect of the first modified layer is larger in size than the crystal defect of the second modified layer.

12. The semiconductor device according to claim 2, wherein the crystal defect of the first modified layer is larger in size than the crystal defect of the second modified layer.

13. The semiconductor device according to claim 3, wherein the crystal defect of the first modified layer is larger in size than the crystal defect of the second modified layer.

14. The semiconductor device according to claim 1, wherein the energy absorbing layer comprises copper, aluminum or an alloy of the copper and aluminum.

15. A manufacturing method of a semiconductor device comprising a semiconductor element provided on a first face of a semiconductor substrate, a first insulation film provided on the semiconductor element, an energy absorbing film provided on the first insulation film, and a second insulation film provided on a second face located opposite to the first face, the method comprising:
   bonding the semiconductor substrate to a tape;
   emitting a laser beam from the second face along a dicing line on the semiconductor substrate so as to be focused on the semiconductor substrate located in a middle area between the first and second faces; and
   stretching the tape to cut the semiconductor substrate on the dicing line to split the semiconductor substrate into a piece of a semiconductor chip, wherein
   in the laser beam emission, the semiconductor substrate located in the middle area between the first and second faces is modified as a first modified layer, and the semiconductor substrate near the energy absorbing film is modified as a second modified layer.

16. The manufacturing method of the semiconductor device according to claim 15, in the laser beam emission, the semiconductor substrate between the first and second modified layers is not modified.

17. The manufacturing method of the semiconductor device according to claim 15, in the laser beam emission, the energy absorbing film is not dissolved.

\* \* \* \* \*